(12) United States Patent
Kang et al.

(10) Patent No.: US 11,315,657 B2
(45) Date of Patent: Apr. 26, 2022

(54) STACKED MEMORY APPARATUS USING ERROR CORRECTION CODE AND REPAIRING METHOD THEREOF

(71) Applicant: INDUSTRY-ACADEMIC COOPERATION FOUNDATION, YONSEI UNIVERSITY, Seoul (KR)

(72) Inventors: Sungho Kang, Seoul (KR); Dong Hyun Han, Seoul (KR); Ha Young Lee, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 176 days.

(21) Appl. No.: 16/750,923

(22) Filed: Jan. 23, 2020

(65) Prior Publication Data

US 2020/0243159 A1 Jul. 30, 2020

(30) Foreign Application Priority Data

Jan. 30, 2019 (KR) .......................... 10-2019-0012161

(51) Int. Cl.
*G11C 29/24* (2006.01)
*G11C 29/00* (2006.01)
*G11C 29/42* (2006.01)
*G06F 11/16* (2006.01)
*G11C 29/12* (2006.01)

(52) U.S. Cl.
CPC ........ *G11C 29/814* (2013.01); *G06F 11/1666* (2013.01); *G11C 29/24* (2013.01); *G11C 29/42* (2013.01); *G11C 29/787* (2013.01); *G11C 29/838* (2013.01); *G11C 2029/1202* (2013.01); *G11C 2029/1204* (2013.01)

(58) Field of Classification Search
CPC ..... G11C 29/814; G11C 29/838; G11C 29/42; G11C 29/787; G11C 29/24; G11C 2029/1204; G11C 2029/1202; G11C 5/025; G06F 11/1666; G06F 11/1048
See application file for complete search history.

(56) References Cited

U.S. PATENT DOCUMENTS

| | | | | |
|---|---|---|---|---|
| 2011/0161784 A1* | 6/2011 | Selinger | ............... | G06F 11/1016 714/768 |
| 2015/0286529 A1* | 10/2015 | Lunde | ................. | G06F 11/1048 714/764 |
| 2016/0124810 A1* | 5/2016 | Yang | ...................... | G11C 29/42 714/764 |

FOREIGN PATENT DOCUMENTS

| | | |
|---|---|---|
| KR | 1020080046826 A | 5/2008 |
| KR | 101424402 B1 | 7/2014 |
| KR | 1020150130888 A | 11/2015 |
| KR | 101843580 B1 | 3/2018 |

* cited by examiner

Primary Examiner — Mohammed A Bashar

(57) ABSTRACT

The present embodiments provide a stacked memory apparatus and a repairing method thereof which store information about a spare resource in a pre-bond process, check a spare resource available in a post-bond process, correct an error through an error correction code, and variably use the same number of spare resources to additionally ensure a number of spare resources in the post-bond process, thereby improving a yield.

8 Claims, 8 Drawing Sheets

[FIG. 1]
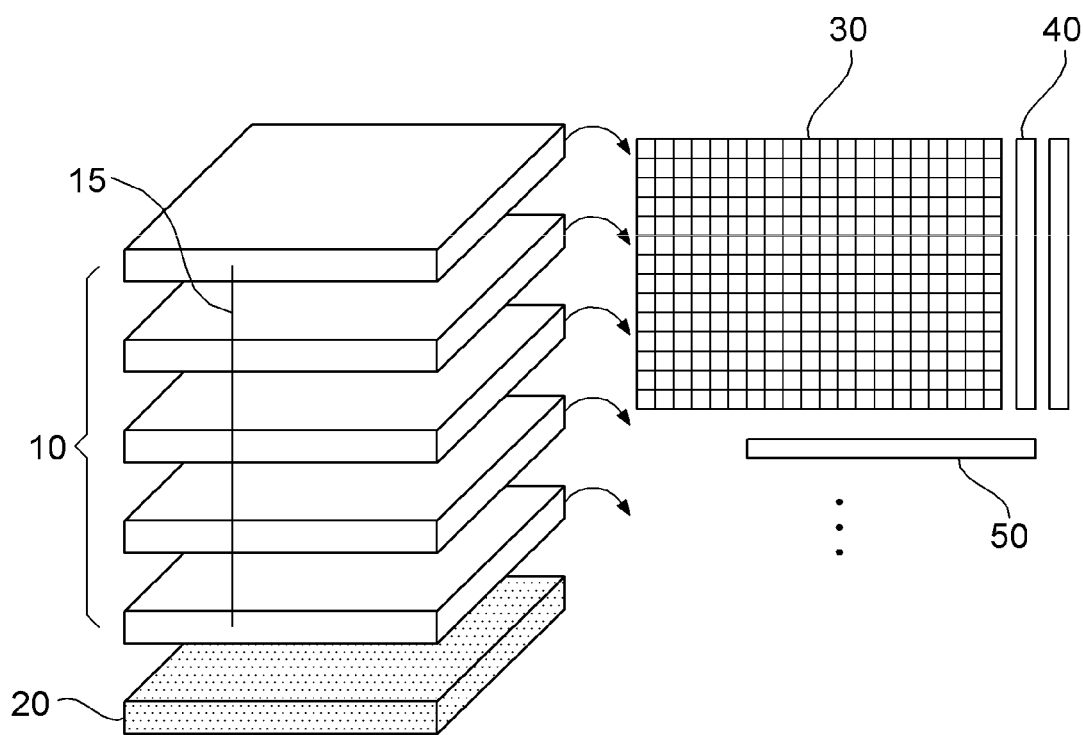

[FIG. 2]
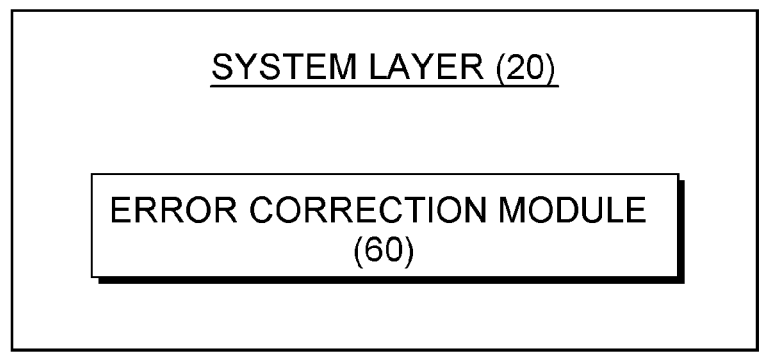

[FIG. 3]
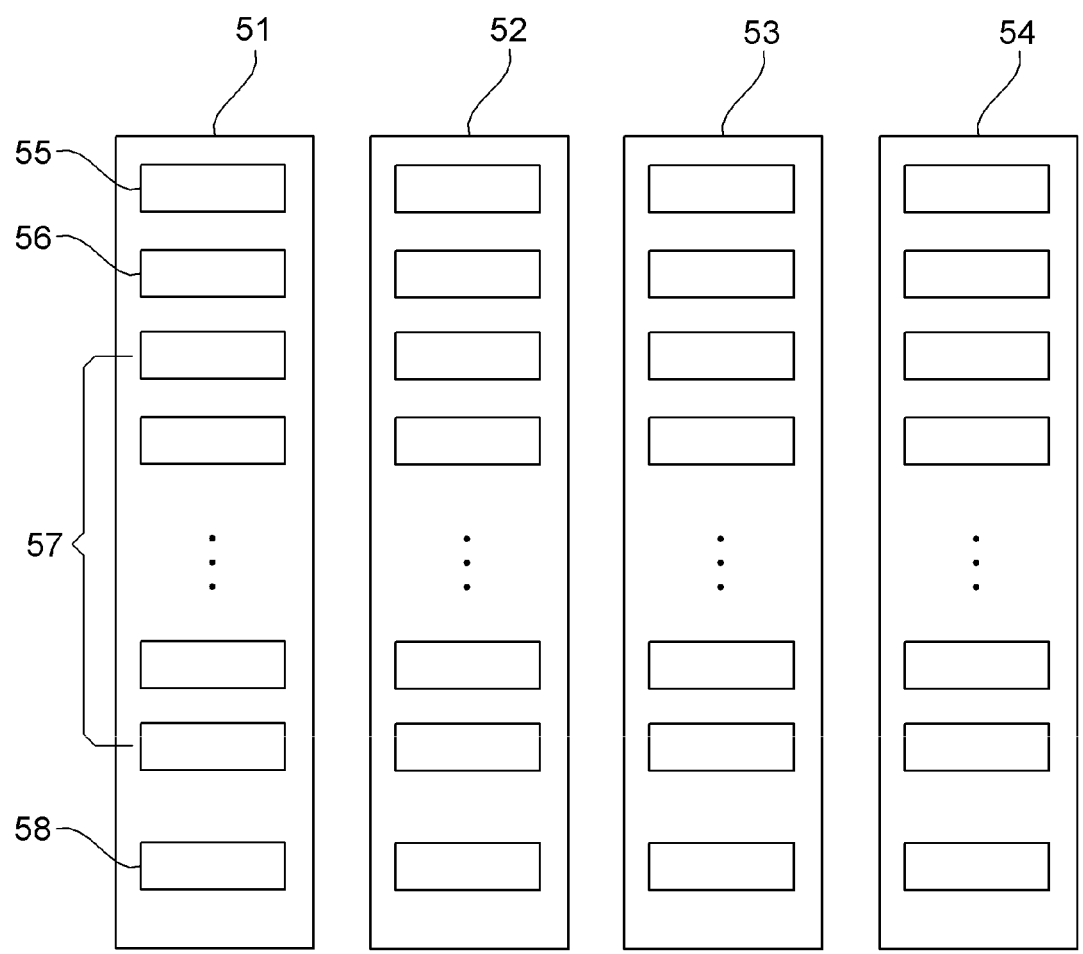

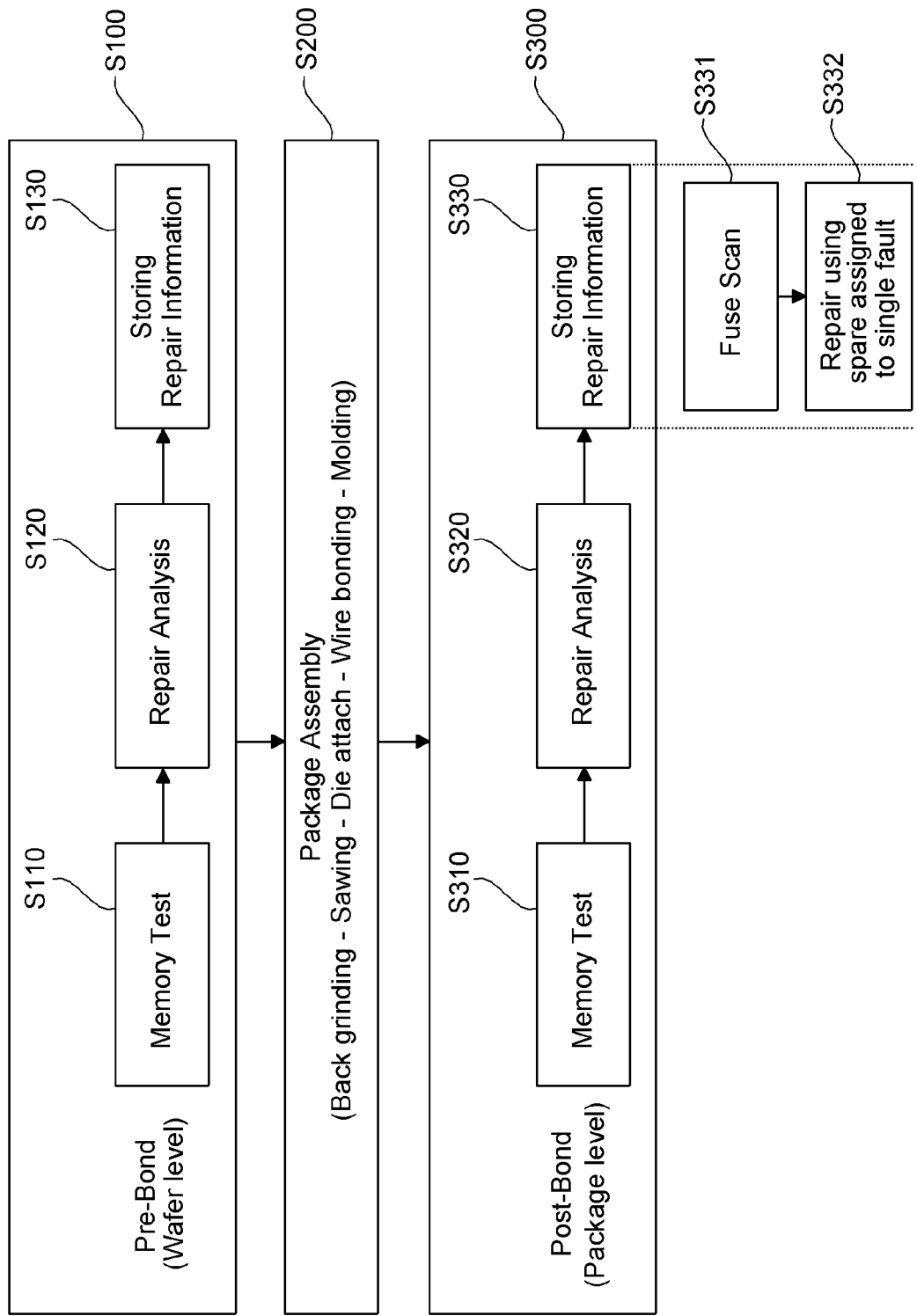
[FIG. 4]

[FIG. 5]
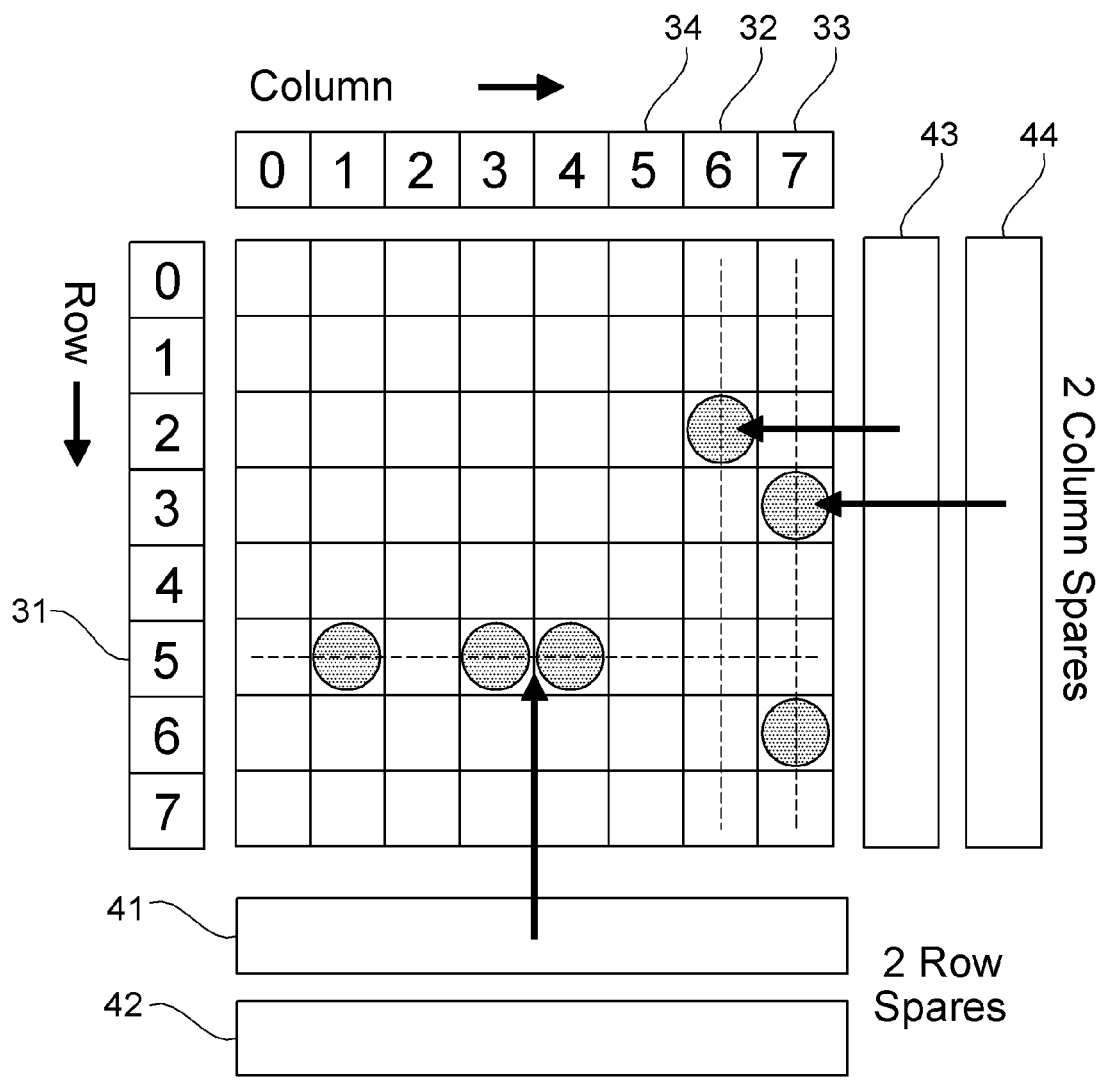

[FIG. 6]
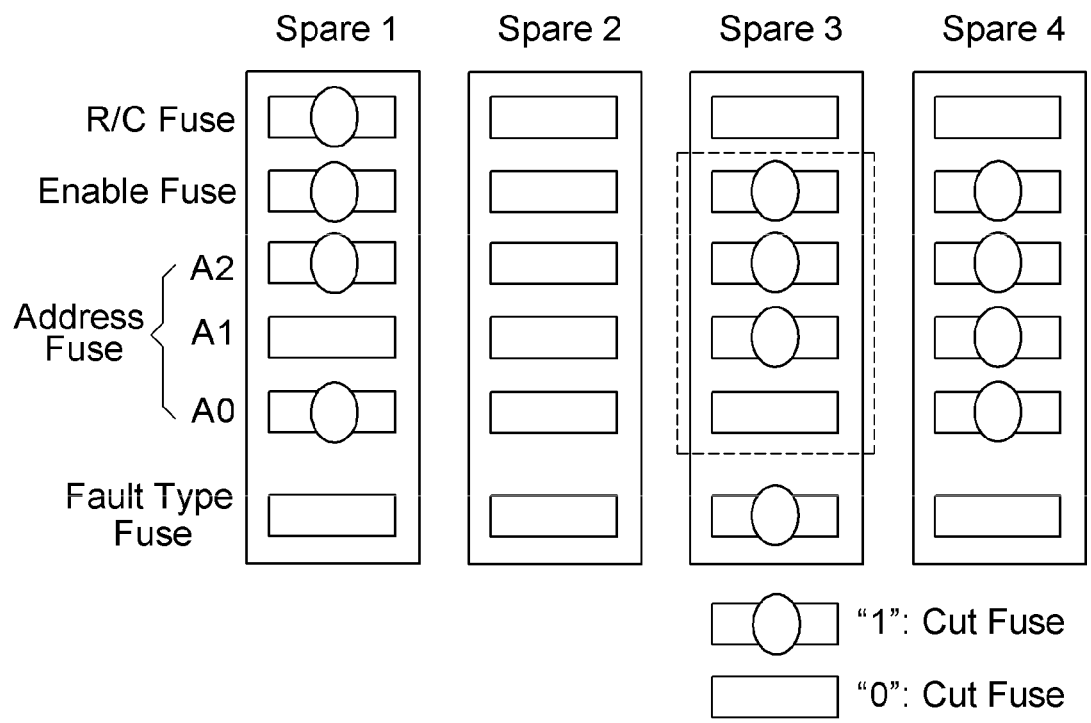

[FIG. 7]
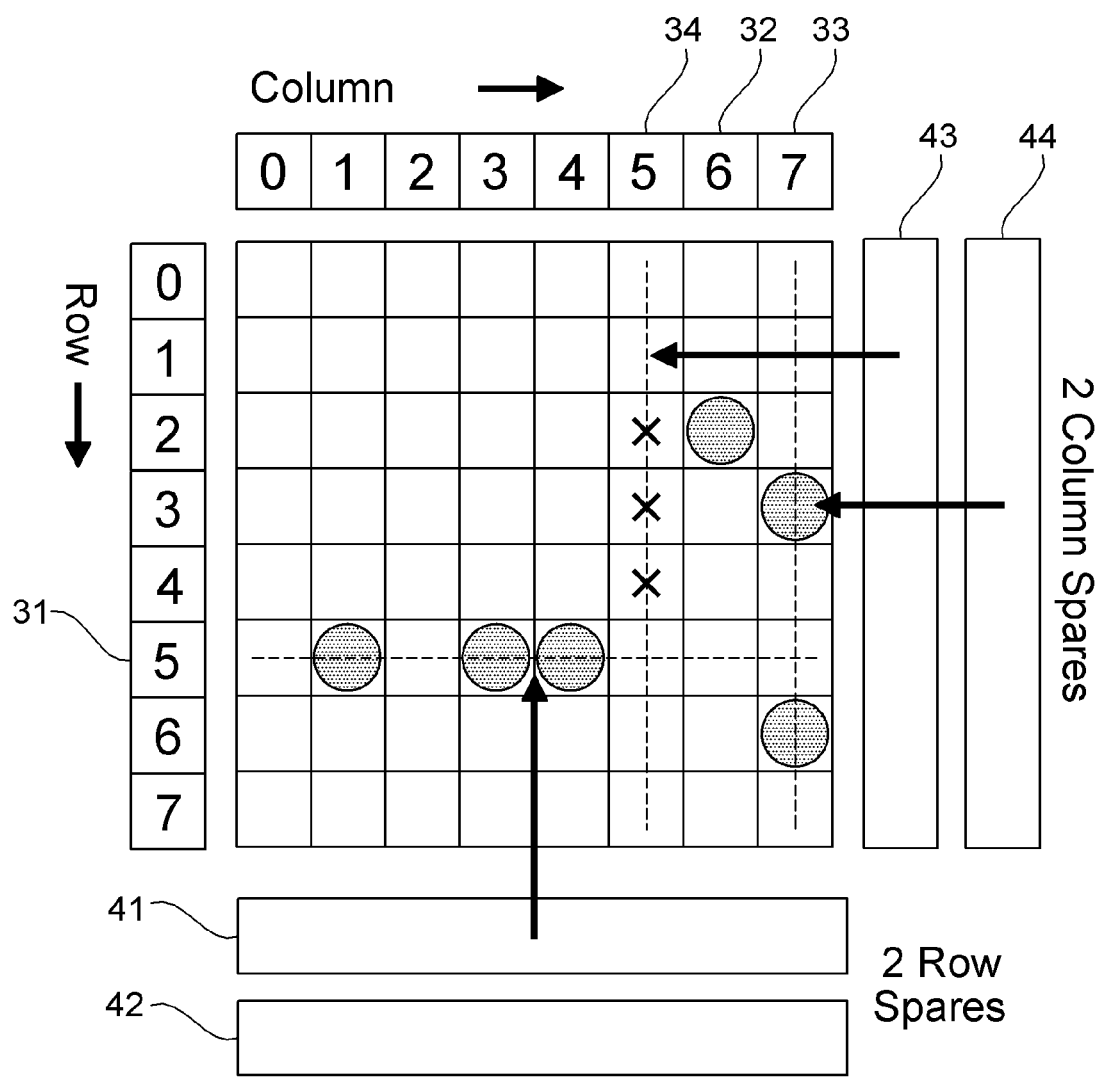

[FIG. 8]
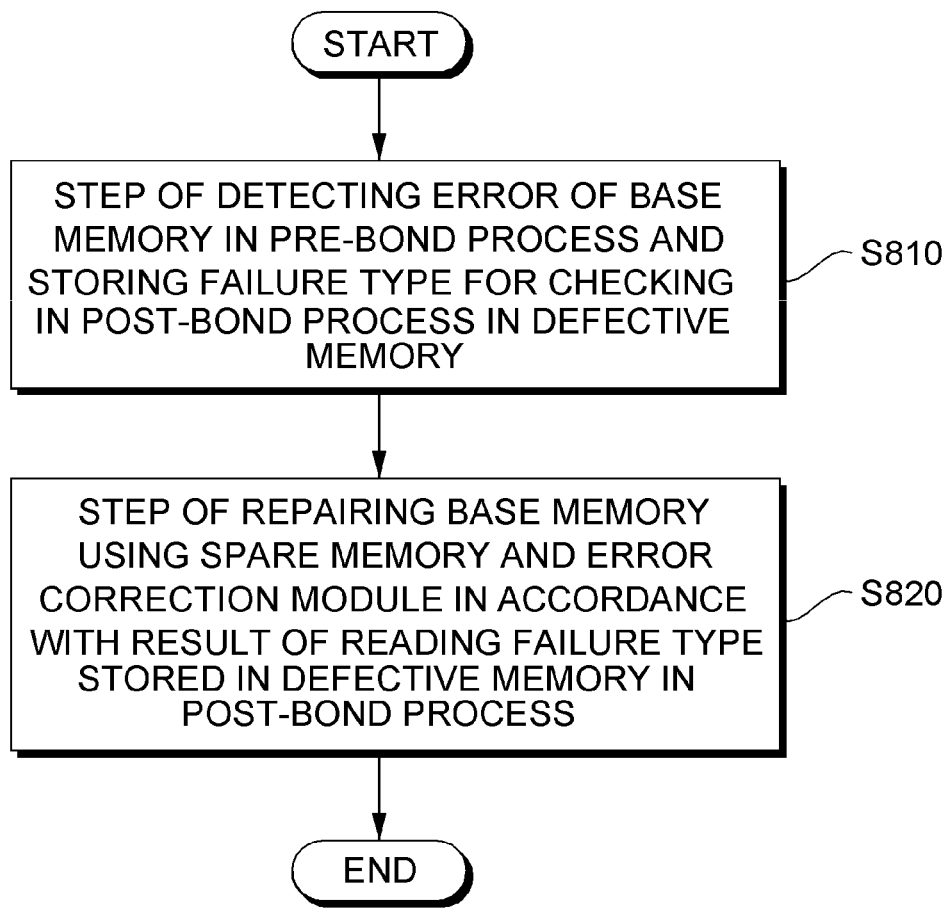

STACKED MEMORY APPARATUS USING ERROR CORRECTION CODE AND REPAIRING METHOD THEREOF

CROSS-REFERENCE TO RELATED APPLICATIONS

This application claims priority to and the benefit of Korean Patent Application No. 10-2019-0012161 filed in the Korean Intellectual Property Office on Jan. 30, 2019, the entire contents of which are incorporated herein by reference.

TECHNICAL FIELD

The present disclosure relates to a repairing method of a stacked memory apparatus. This research relates to a test and a tester technique for improving a yield of TSV based 3D IC of an industry technical innovation project supported by Ministry of Trade, Industry, and Energy (No. 2018-11-0764).

BACKGROUND ART

The contents described in this section merely provide background information on the present exemplary embodiment but do not constitute the related art.

A 3D memory has evolved as a density per area of a memory cell has reached its physical limit, and as the layers of memory are stacked, a high repair rate is required. A spare cell is prepared for every layer of the memory.

As spare cells, there are spare cells for a pre-bond process which is a repair process performed on a wafer and spare cells for a post-bond process which is a repair process performed after laminating a memory. That is, failure information of the memory is checked two times through the pre-bond process and the post-bond process and the repair is performed.

According to the repair method of the related art, except a spare resource used for repair in the pre-bond process, remaining spare resources are used for repair in the post-bond process. In this case, when an available spare resource is not enough, the entire memory needs to be discarded. When the repair is not possible during the pre-bond process, only one memory die can be discarded. However, when the repair is not possible during the post-bond process, there is a problem in that all the laminated memories need to be discarded.

RELATED ART DOCUMENT

Patent Document (Patent Document 1) Korean Registered Patent Publication No. 10-1843580 (Mar. 30, 2018)
(Patent Document 2) Korean Registered Patent Publication No. 10-1424402 (Jul. 22, 2014)

SUMMARY OF THE INVENTION

A major object of the present disclosure is to store information about a spare resource in a pre-bond process, check a spare resource available in a post-bond process, correct an error through an error correction code, and variably use the same number of spare resources to additionally ensure a number of spare resources in the post-bond process.

Other and further objects of the present disclosure which are not specifically described can be further considered within the scope easily deduced from the following detailed description and the effect.

According to an aspect of the present embodiment, a stacked memory apparatus including a plurality of memory layers and a system layer is provided in which a base memory is disposed on the plurality of memory layers, the system layer includes an error correction module, and the plurality of memory layers includes a spare memory which replaces a cell of the base memory in which an error occurs and a defective memory which stores a failure state of a cell of the base memory in which an error occurs.

The error correction module is a module which detects and corrects a single error or a plurality of errors of data and generates a check bit when a data bit is written in the base memory or the spare memory, compares the data bit and the check bit when the data bit is read out to determine an error bit among the data bits, and corrects the error bit.

The system layer may include an additional spare memory and an additional defective memory.

The defective memory may be implemented by a fuse, a non-volatile storage element, or a combination thereof.

The defective memory stores (i) first information about the spare memory, (ii) second information about the base memory, (iii) third information about a failure type, or a combination thereof.

In the pre-bond process, the defective memory may store information indicating whether the spare memory corresponds to a row or a column and information indicating whether the spare memory is used for a solution as first information about the spare memory.

In the pre-bond process, the defective memory may store information indicating which row or column of the base memory is supposed to be repaired by the spare memory as second information about the base memory.

In the pre-bond process, the defective memory may store the number of cells of rows or columns of the plurality of memory layers in which errors occur as third information about the failure type.

In the post-bond process, the error correction module may correct the cell in which an error corresponding to the failure type occurs in accordance with a result of reading third information about the failure type.

In the pre-bond process, the failure state of the cell is stored without repairing the cell of the base memory in which an error occurs and in the pose-bond process, the cell of the base memory in which an error occurs may be partially or entirely repaired by referring to the failure state of the cell.

According to another aspect of the present embodiment, a repairing method of a stacked memory apparatus includes detecting an error of a base memory and storing a failure type for checking in a post-bond process in a defective memory in a pre-bond process and repairing the base memory by a spare memory and an error correction module in accordance with a result of reading the failure type stored in the defective memory in the post-bond process.

In the pre-bond process, the failure state of the cell is stored without repairing the cell of the base memory in which an error occurs and in the pose-bond process, the cell of the base memory in which an error occurs may be partially or entirely repaired by referring to the failure state of the cell.

As described above, according to the embodiments of the present disclosure, a number of spare resources in the post-bond process is additionally ensured by storing information about a spare resource in a pre-bond process, checking a spare resource available in a post-bond process, correcting an error through an error correction code, and variably using the same number of spare resources, thereby improving a yield. Even if the effects are not explicitly mentioned here, the effects described in the following specification which are expected by the technical features of the present disclosure and their potential effects are handled as described in the specification of the present disclosure.

BRIEF DESCRIPTION OF THE DRAWINGS

FIG. 1 is a view illustrating a structure of a stacked memory apparatus according to one embodiment of the present disclosure;

FIG. 2 is a block diagram illustrating a system layer of a stacked memory apparatus according to one embodiment of the present disclosure;

FIG. 3 is a view illustrating a defective memory of a stacked memory apparatus according to one embodiment of the present disclosure;

FIG. 4 is a block diagram illustrating a repairing process of a stacked memory apparatus according to one embodiment of the present disclosure;

FIG. 5 is a view illustrating that a stacked memory apparatus according to one embodiment of the present disclosure finds out a solution in a pre-bond process;

FIG. 6 is a view illustrating that a stacked memory apparatus according to one embodiment of the present disclosure stores a failure type in a defective memory in a pre-bond process;

FIG. 7 is a view illustrating that a stacked memory apparatus according to one embodiment of the present disclosure finds out a solution in a post-bond process; and FIG. 8 is a flowchart illustrating a repairing method of a stacked memory apparatus according to another exemplary embodiment of the present disclosure.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

FIG. 1 is a view illustrating a structure of a stacked memory apparatus. A stacked memory apparatus refers to a three-dimensional computer memory including one or more combined memory die layers, memory packages, and other memory elements. Referring to FIG. 1, the stacked memory apparatus includes a plurality of memory layers 10 and a system layer 20 and may be implemented on a substrate. The stacked memory apparatus may be vertically stacked or horizontally stacked (for example, side-by-side) or may include memory elements which are combined with each other. The plurality of memory layers 10 may be implemented by a dynamic random access memory (DRAM), but is not limited thereto. In accordance with the advent of a stacked DRAM standard (Wide 10), a DRAM wafer may be laminated on the same package having a memory stack together with a system element such as a system on chip (SoC) wafer. In the stacked memory apparatus, the memory layers for every apparatus may vary depending on manufactures of the DRAM.

The plurality of memory layers 10 may be interconnected to each other through a through silicon via 15. The stacked memory uses through silicon via (TSV) manufacturing techniques and vias are produced through silicon dies to provide signal passages through the memory stack. When the connection is performed by the through silicon via, an uppermost (or outermost) memory die layer may be excluded.

The system layer 20 may include elements such as a central processing unit (CPU), a memory controller, and other related system elements. The system layer may include a system on chip (SoC). The logic chip may be an application processor or a graphics processing unit (GPU).

The memory repair is comprehensive and may be applied to an arbitrary memory format which is performed by a memory manufacturing company. In some embodiments, the memory apparatus stores data in a separate memory such as CAM or converts addresses of defective parts of the memory into perfect parts of the memory to provide redundancy for the defective elements. In some embodiments, spare rows, columns, or blocks of the defective memory of the memory may be implemented in a predetermined existing DRAMs.

FIG. 2 is a block diagram illustrating a system layer of the stacked memory apparatus.

The system layer 20 includes an error correction module 60. The system layer 20 may omit some components among various components which are exemplarily illustrated in FIG. 2 or may additionally include other component. For example, the system layer 20 may include an additional defective memory (not illustrated), a memory controller (not illustrated), or a combination thereof.

The plurality of memory layers 10 may include a base memory 30. The base memory may be implemented by various memories such as a dynamic random access memory (DRAM).

The plurality of memory layers 10 may include a base memory 40 and a defective memory 50. The system layer 20 may include an additional spare memory and/or an additional defective memory.

The spare memory 40 replaces a cell where an error occurs in the base memory 30. The spare memory 40 replaces one or more cells in which an error occurs in the unit of cell or line. The spare memory 40 repairs by replacing a line connected to a row or a column of the plurality of memory layers. The spare memory 40 repairs by replacing a line connected to a row or a column of the base memory. The spare memory 40 may use a physical replacement or perform a logic replacement which operates like a matrix corresponding to a memory layer.

The defective memory 50 stores information of a cell in which an error occurs in the spare memory 30. The defective memory 50 may be implemented by a non-volatile memory. For example, the defective memory 50 may be implemented in a fuse manner.

The defective memory 50 may store (i) first information about the spare memory 40, (ii) second information about the base memory 30, and (iii) third information about a failure type.

The error correction module 60 is a module which detects and corrects a single data error or a plurality of data errors using an error correction code (ECC). The error correction module 60 generates a check bit when a data bit is recorded in the base memory 30 or the spare memory 40. The error correction module 60 compares the data bit and the check bit when the data bit is read out to determine an error bit among the data bits. The error bit is corrected based on a value obtained by comparing the data bit and the check bit.

The memory controller controls an operation of writing data and an operation of reading data of the base memory 30 or the spare memory 40 corresponding to a specific memory layer among the plurality of memory layers.

FIG. 3 is a view illustrating a defective memory of the stacked memory apparatus.

Solution information created during the pre-bond process may be stored in the defective memory. The solution information is a method for replacing a cell of the base memory in which an error occurs with a spare memory. The defective memory according to the embodiment records which type of failure distribution is repaired by each solution.

The plurality of defective memories 51, 52, 53, and 54 may include information corresponding to a plurality of spare memories. The defective memory 51 may store first information about the spare memory, second information about the base memory, and third information about a failure type.

In the pre-bond process, the defective memory 51 may store information 55 indicating whether the spare memory corresponds to a row or a column and information 56 indicating whether the spare memory is used for a solution as first information about the spare memory.

In the pre-bond process, the defective memory 51 may store information 57 indicating which row or column of the base memory will be repaired by the spare memory as second information about the base memory.

In the pre-bond process, the defective memory 51 may store the number of cells in rows or columns of the plurality of memory layers in which errors occur as third information about the failure type.

According to an example in which two rows and two columns are used for spare resources and the defective memory is implemented with a fuse structure, the defective memory 51 may include an R/C fuse 55, an enable fuse 56, an address fuse 57, and a fault type fuse 58. A connected state is set as a logic 1 and a disconnected state is set as a logic 0 or a disconnected state is set as a logic 1 and a connected state is set as a logic 0.

The R/C fuse 55 identifies which one of a row spare resource and a column spare resource is a spare resource to be used. The Enable fuse indicates whether the spare source is used for the solution. The Address fuse indicates which row or column is repaired by each spare resource. The Fault type fuse indicates what kind of failure distribution is repaired by the spare resource.

A row type or a column type spare resource may be divided into cases where the number of failures supposed to be repaired by one spare resource is plural or singular. The fault type fuse indicates whether the spare resource repairs one failure or a plurality of failures. When one failure is repaired, the one failure may be repaired by the error correction code (ECC), rather than the spare resource.

A spare resource supposed to be arranged for repairing a cell in the pre-bond process, an address where the failure occurs, and a type of failure may be stored in a non-volatile storage element such as a fuse structure. When the spare resource is not enough as a result of calculating a solution in the post-bond process, the spare resource arranged to repair the single failure in the pre-bond process may be used to repair the failure in the post-bond process. An address of a cell, a row, or a column where a single failure occurs is transmitted to the error correction module. Data of a cell processible by the error correction module may be corrected using the error correction module, rather than the arranged spare resource.

FIG. 4 is a flowchart illustrating a repairing process of the stacked memory apparatus.

There are three main processes for the stacked memory apparatus. The process includes a pre-bond process S100, a packaging process S200, and a post-bond process S300.

In step S110, the stacked memory apparatus inspects a memory layer using automatic test equipment (ATE) and obtains failure data. In step S120, the stacked memory apparatus collects the failure data. In step S120, the stacked memory apparatus analyzes the failure data using the ATE to obtain a substitute solution.

The ATE is equipment which automatically tests the stacked memory apparatus, that is, a device under test (DUT) and is configured by a microcomputer or a microprocessor based system. The ATE is electrically coupled to a built off self test (BOST) circuit through a test header. The ATE may directly input a test pattern to the DUT or may be electrically connected to the DUT through the BOST circuit to input the test pattern to the DUT. An output of the DUT and an expected value are compared to determine an error of the DUT. The DUT is mounted in a socket of the BOST circuit to be electrically coupled.

The ATE may be connected to an external server using an interface. The server provides a user interface to provide an environment to allow a user to create a test program suitable for a characteristic of the DUT to be tested. Further, the server may provide a user interface which transmits the test program to the ATE and receives a test result from the ATE to analyze the test result. The server may be any type of processing device and includes an existing personal computer (PC), a desktop device or a portable device, a microprocessor computer, a microprocessor based or programmable consumer electronic device, a miniature computer, a main frame computer, and/or a personal mobile computing device, but is not limited thereto.

The BOST circuit may be formed by a printed circuit board and includes a plurality of conductive patterns formed to electrically connect the ATE and the DUT. The plurality of conductive patterns may include input/output test signal lines, clock signal lines, and power lines. The BOST circuit may include a test board or a high fidelity tester access fixture (HI FIX).

The stacked memory apparatus may test the memory using a built in self text (BIST) circuit. The BIST circuit requires a test pattern generator and a memory which stores a test result. The BIST circuit is assembled in the stacked memory apparatus to generate test data and compares a test result to detect defective memory cells to perform self-repair.

A method of repairing a stacked memory apparatus according to the embodiment adds a step S130 of storing failure information to a defective memory to an existing method. The defective memory stores which type of failure distribution is supposed to be repaired by the spare resource. In a next process, it may be used as information to determine whether a failure corresponding to each spare resource can be repaired with the error correction code (ECC).

In the packaging process S200, a general packaging technique in a field of memories may be applied as a process of laminating a plurality of memories.

The existing method may be applied to steps S310, S320, and S330 of deducing a repair solution in the post-bond process S300. According to the existing method, when the repair solution cannot be deduced by a currently arranged spare resource, it is difficult to physically add the spare resource to a memory which is already produced on a wafer to be stacked.

The method of repairing by the stacked memory apparatus according to the embodiment may actually utilize the spare resource which is allocated in the pre-bond process to repair in the post-bond process. In step S331, a defective memory such as a fuse structure is scanned. In step S332, a spare resource which may be replaced with the error correction code may apply an address of the defective cell, row, or column to the error correction code and may be used for the post-bond process. The repair solution may be deduced again using a spare resource which is additionally ensured. Since an absolute amount of the spare resource available in the post-bond process is increased, the yield of the memory may be enhanced.

Hereinafter, an operation of finding a solution and storing a failure type in the pre-bond process and finding a solution and repairing by referring to the previously stored failure type in the post-bond process will be described with reference to FIGS. 5 to 7.

FIG. 5 is a view illustrating that the stacked memory apparatus finds a solution in the pre-bond process and FIG. 6 is a view illustrating that a stacked memory apparatus stores a failure type in a defective memory in a pre-bond process.

Referring to FIG. 5, it is assumed that there are spare memories 41, 42, 43, and 44 which replace rows and columns of the base memory in the unit of line. For example, as a solution for six defective cells, Row 5 (31) in which three cells are fault is replaced with Spare 1 (41), Column 6 (32) in which one cell is fault is replaced with Spare 3 (43), and Column 7 (32) in which two cells are fault is replaced with Spare 3 (44).

Referring to FIG. 6, in a fuse structure corresponding to Spare 1, R/C fuse is changed to 1, Enable Fuse is changed to 1, and Address Fuse is changed to 5. In Spare 3, Enable Fuse is changed to 1, Address Fuse is changed to 6, and Fault Type Fuse is changed to 1. In Spare 4, Enable Fuse is changed to 1 and Address Fuse is changed to 7.

In the pre-bond process, when information is stored in the fuse structure after generating a repair solution, since Spare 3 among used spare resources is repairing a single failure, the Fault Type Fuse is displayed as 1.

FIG. 7 is a view illustrating that the stacked memory apparatus finds a solution in the pre-bond process.

In the post-bond process, when it is assumed that three cells in Column 5 (34) are fault, the failure cannot be repaired according to the existing method.

The stacked memory apparatus according to the embodiment reads out a stored defective memory. As a result of reading out the defective memory, since there is a spare resource having Fault Type Fuse represented to be 1, repair is possible using the corresponding spare resource even in the post-bond process. The failure which is supposed to be repaired by allocating a spare resource may be repaired by an error correction code ECC. Even though according to the existing method, the resource cannot be used, the spare memory is additionally ensured to deduce the solution again. In the post-bond process, the error correction module may correct the cell in which an error corresponding to the failure type occurs in accordance with a result of reading third information about the failure type. The faulty state in which a cell of the base memory in which an error occurs is stored without being repaired in the pre-bond process is referenced in the post-bond process to repair partially or entirely the cell on the base memory in which an error occurs.

FIG. 8 is a flowchart illustrating a repairing method of a stacked memory apparatus according to another exemplary embodiment of the present disclosure.

The repairing method of the stacked memory apparatus includes a step S810 of storing a failure type in a pre-bond process and a step S820 of repairing through an error correction module in a post-bond process.

In the step S810 of storing a failure type, an error of a base memory is detected in the pre-bond process and a failure type is stored in the defective memory to be checked in the post-bond process.

In the step S820 of repairing through an error correction module, a cell in which a failure corresponding to the failure type occurs is repaired using the error correction module in accordance with a result of reading a failure type stored in the defective memory in the post-bond process.

In the post-bond process, the spare memory may repair the error by replacing a line connected to a row or a column of a plurality of memory layers included in the stacked memory apparatus.

According to the present embodiment, in the pre-bond process, a failure address to which a spare resource is to be arranged in the post-bond process or address information where the failure occurs is stored. In the post-bond process, an available spare resource is confirmed, the error is corrected using the error correction code, and the same number of spare resources is variably used so that the number of spare resources is additionally ensured in the post-bond process, to improve a yield.

A plurality of components included in the stacked memory apparatus are combined to each other to be implemented by at least one module. The components are connected to a communication path which connects a software module or a hardware module in the apparatus to organically operate between the components. The components communicate with each other using one or more communication buses or signal lines.

The stacked memory apparatus may be implemented in a logic circuit by hardware, firm ware, software, or a combination thereof or may be implemented using a general purpose or special purpose computer. The device may be implemented using hardwired device, field programmable gate ware (FPFA) or application specific integrated circuit (ASIC). Further, the device may be implemented by a system on chip (SoC) including one or more processors and a controller.

The stacked memory apparatus may be mounted in a computing device provided with a hardware element as a software, a hardware, or a combination thereof.

The computing device may refer to various devices including all or some of a communication device for communicating with various devices and wired/wireless communication networks such as a communication modem, a memory which stores data for executing programs, and a microprocessor which executes programs to perform operations and commands.

In FIG. 4, the respective processes are sequentially performed, but this is merely illustrative and those skilled in the art may apply various modifications and changes by changing the order illustrated in the drawings or performing one or more processes in parallel or adding another process without departing from the essential gist of the exemplary embodiment of the present disclosure.

The operation according to the exemplary embodiment of the present disclosure may be implemented as a program command which may be executed by various computers to be recorded in a computer readable medium. The computer readable medium indicates an arbitrary medium which participates to provide a command to a processor for execution. The computer readable medium may include solely a program command, a data file, and a data structure or a combination thereof. For example, the computer readable medium may include a magnetic medium, an optical recording medium, and a memory. The computer program may be distributed on a networked computer system so that the computer readable code may be stored and executed in a distributed manner. Functional programs, codes, and code segments for implementing the present embodiment may be easily inferred by programmers in the art to which this embodiment belongs.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. A stacked memory apparatus including a plurality of memory layers and a system layer,
    wherein a base memory is disposed on the plurality of memory layers, the system layer includes an error correction module, and the plurality of memory layers includes a spare memory which replaces a cell of the base memory in which an error occurs and a failure state recording memory which stores a failure state of the cell of the base memory in which an error occurs,
    wherein the failure state recording memory stores (i) first information about the spare memory, (ii) second information about the base memory, and (iii) third information about a failure type,
    wherein the first information includes information indicating whether the spare memory corresponds to a row or a column and information indicating whether the spare memory is used for a solution,
    wherein the second information includes information indicating which row or column of the base memory is to be repaired by the spare memory, and
    wherein the third information includes information on a number of cells in rows or columns of the plurality of memory layers in which errors occur.

2. The stacked memory apparatus according to claim 1, wherein the error correction module is a module which detects and corrects a single error or a plurality of errors of data and generates a check bit when a data bit is written in the base memory or the spare memory, compares the data bit and the check bit when the data bit is read out to determine an error bit among data bits, and corrects the error bit.

3. The stacked memory apparatus according to claim 1, wherein the system layer includes an additional spare memory and an additional failure state recording memory.

4. The stacked memory apparatus according to claim 1, wherein the failure state recording memory is implemented by a fuse, a non-volatile storage element, or a combination thereof.

5. The stacked memory apparatus according to claim 1, wherein the error correction module corrects data of a cell in which an error corresponding to the failure type occurs in accordance with a result of reading the third information about the failure type.

6. The stacked memory apparatus according to claim 1, wherein the failure state recording memory stores the failure state of the cell without repairing the cell of the base memory in which an error occurs and the error correction module partially or entirely repairs the cell of the base memory in which an error occurs by referring to the failure state of the cell.

7. A repairing method of a stacked memory apparatus, comprising:
    detecting an error of a base memory and storing a failure type for checking in a post-bond process in a failure state recording memory, in a pre-bond process; and
    repairing the base memory by a spare memory and an error correction module in accordance with a result of reading the failure type stored in the failure state recording memory in the post-bond process,
    wherein the failure state recording memory stores (i) first information about the spare memory, (ii) second information about the base memory, and (iii) third information about the failure type,
    wherein the first information includes information indicating whether the spare memory corresponds to a row or a column of a plurality of memory layers included in the stacked memory apparatus and information indicating whether the spare memory is used for a solution,
    wherein the second information includes information indicating which row or column of the base memory is to be repaired by the spare memory, and
    wherein the third information includes information on a number of cells in rows or columns of the plurality of memory layers in which errors occur.

8. The repairing method according to claim 7, wherein in the pre-bond process, a failure state of a cell of the base memory in which an error occurs is stored, and in the post-bond process, the cell of the base memory in which an error occurs is partially or entirely repaired by referring to the failure state of the cell.

* * * * *